(12) United States Patent
Lin et al.

(10) Patent No.: US 7,353,077 B2
(45) Date of Patent: Apr. 1, 2008

(54) METHODS FOR OPTIMIZING DIE PLACEMENT

(75) Inventors: Chih-Wei Lin, Hsinchu (TW);
Hong-Hsing Chou, Taipei (TW);
Yeh-Jye Wang, Hsinchu (TW);
Chen-Fu Chien, Hsinchu (TW);
Jen-Hsin Wang, Sindian (TW);
Chih-Wei Hsiao, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 229 days.

(21) Appl. No.: 11/222,374

(22) Filed: Sep. 8, 2005

(65) Prior Publication Data
US 2007/0027567 A1 Feb. 1, 2007

Related U.S. Application Data

(60) Provisional application No. 60/703,542, filed on Jul. 29, 2005.

(51) Int. Cl.
*G06F 19/00* (2006.01)
(52) U.S. Cl. .............. 700/121; 716/2; 716/8; 716/21
(58) Field of Classification Search ........... 700/121; 716/2, 8–10, 21
See application file for complete search history.

(56) References Cited

U.S. PATENT DOCUMENTS

| 5,305,222 | A | * | 4/1994 | Nakamura ............... 700/121 |
| 6,016,391 | A | | 1/2000 | Facchini et al. |
| 6,368,761 | B1 | * | 4/2002 | Chien et al. ............. 430/22 |
| 6,522,940 | B1 | | 2/2003 | Erck et al. |
| 6,826,738 | B2 | | 11/2004 | Cadouri |
| 7,033,847 | B2 | * | 4/2006 | Tai et al. ................. 438/15 |
| 2006/0031801 | A1 | * | 2/2006 | McIntyre et al. ............ 716/8 |

* cited by examiner

*Primary Examiner*—Leo Picard
*Assistant Examiner*—Steven R. Garland
(74) *Attorney, Agent, or Firm*—Haynes Boone, LLP

(57) ABSTRACT

A method of optimizing die placement on a wafer having an alignment mark with a computing system includes arranging a plurality of fields on the wafer in a first position. Dummies are inserted between at least one arranged field and the alignment mark and inserted adjacent to the wafer edge. The total number of dies manufacturable on the wafer at the first position is determined. The wafer position is shifted to a second position relative to the position of the plurality of fields, and the total number of dies manufacturable on the wafer at the second position is determined. The total number of manufacturable dies from each of the first and the second positions is compared, and the positions having the higher number of manufacturable die are candidates of optimal die placement position. Then the total number of fields, the total number of dummies, and the total number of shared dummies are evaluated to decide the optimal die placement position.

21 Claims, 7 Drawing Sheets

METHODS FOR OPTIMIZING DIE PLACEMENT

RELATED APPLICATION DATA

This patent application claims the benefit of U.S. Provisional Patent Application No. 60/703,542 filed Jul. 29, 2005.

FIELD OF THE INVENTION

The present disclosure relates generally to methods of optimizing die placement on a substrate.

BACKGROUND

Fitting a number of rectangular die on a round wafer typically has a single goal—arranging the die so that as many die as possible can be placed on a single wafer. The die are arranged on the wafer during an exposure process, such as photolithography, and a typical exposure process will use a mask or "reticle". The reticle will often have 1, 2, or more die, and a reticle is typically exposed or processed at a single time, so that all of the die in the reticle are exposed at one time. The wafer can then be moved to a next location and the group of dies in the reticle are exposed again.

Through trial and error or mathematical algorithm, a determination can be made as to how many dies can be placed on a wafer, and the number of good dies. The number of "good" dies on wafer includes all the dies, excluding those dies that are exposed but will never be fully operational because they are incomplete (e.g., they are only partially on the wafer) and/or they are fatally flawed (e.g., they are located on a beveled edge of the wafer). It is understood that a good die may be incomplete or fatally flawed for other reasons, such as a wafer defect or particle—but a good die has the potential to be a full and functional die.

The present disclosure provides a method for optimizing die placement that goes beyond simply finding the greatest number of good die per wafer. The present disclosure considers other factors, including processing time and peripheral die yield.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Embodiments of the present invention are now described with reference to the figures where reference numbers indicate identical or functionally similar elements. While specific configurations and positions are discussed, it should be understood that this is done for illustrative purposes only. Specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and clarity, and such repetition does not indicate any required combination of features or steps throughout the drawings.

Figure 1:
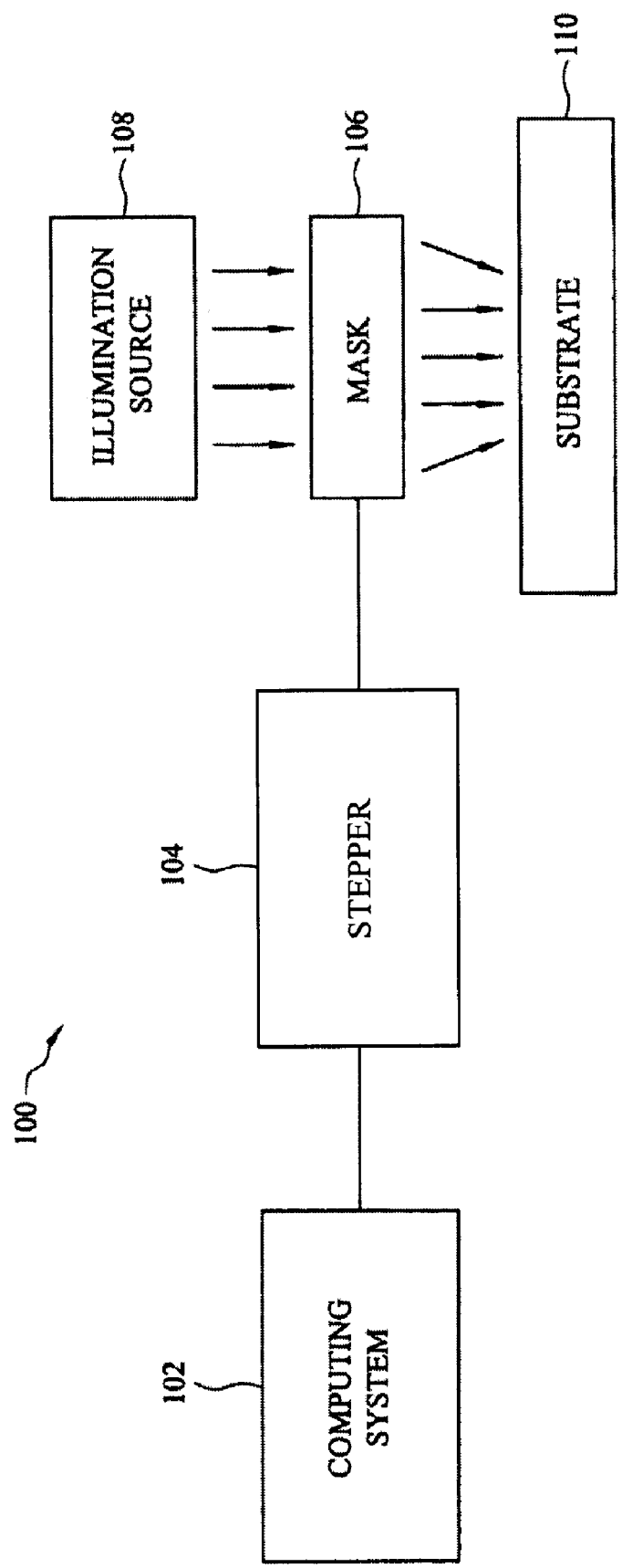
FIG. 1 is a block diagram showing an exemplary semiconductor manufacturing system.

Referring to FIG. 1, a semiconductor lithographic manufacturing system 100 includes a computing system 102, a stepper or scanner workstation 104, a mask 106, and an illumination source 108. The system 100 is simplified in the figure, and shows the stepper or scanner workstation 104 being connected to the mask 106. Relative movement between the mask 106 and a substrate 110 is needed, and this can be accomplished by moving one or both of these items. Furthermore, the mask 106 can move, such as in digital lithography or electron beam lithography. One skilled in the art will appreciate that many different types of semiconductor lithographic manufacturing systems 100 can benefit from one or more embodiments of the present invention.

The computing system 102 may include a number of standard components, such as a processor, a memory, and a display, among other things. The computing system 102 may be configured to perform a method of optimizing die placement for the semiconductor manufacturing system 100. In one embodiment, the computing system 102 is directly connected to the stepper or scanner workstation 104 or is integral to the stepper. In another embodiment, the computing system 102 is separate from the stepper or scanner workstation 104, as may occur, for example, when the computing system 102 is at a design facility and the stepper or scanner workstation 104 the mask 106 and the illumination source 108 are at a manufacturing facility. In such a case, the computing system 102 may communicate with the stepper or scanner workstation 104 over a wired or wireless network. In yet other embodiments, the computing system may be configured to write data to a portable storage medium, such as, for example, a floppy disc, CD, or DVD, that may be physically delivered to the stepper or scanner workstation 104. Other methods for transferring data from the computing system 102 to the stepper or scanner workstation 104 also may be used.

The substrate 110 may be any component manufacturable by the mask 106 and the illumination source 108, and in one example, may be a semiconductor wafer. The stepper or scanner workstation 104, the mask 106, and the illumination source 108 may be conventional components and may be operable to manufacture the substrate 110 in a manner known in the art. Therefore, further description of these components is not provided. However, the stepper or scanner workstation 104, the mask 106, and the illumination source 108 all may be controlled based upon data from the computing system 102 to optimize the die placement.

Figure 2:
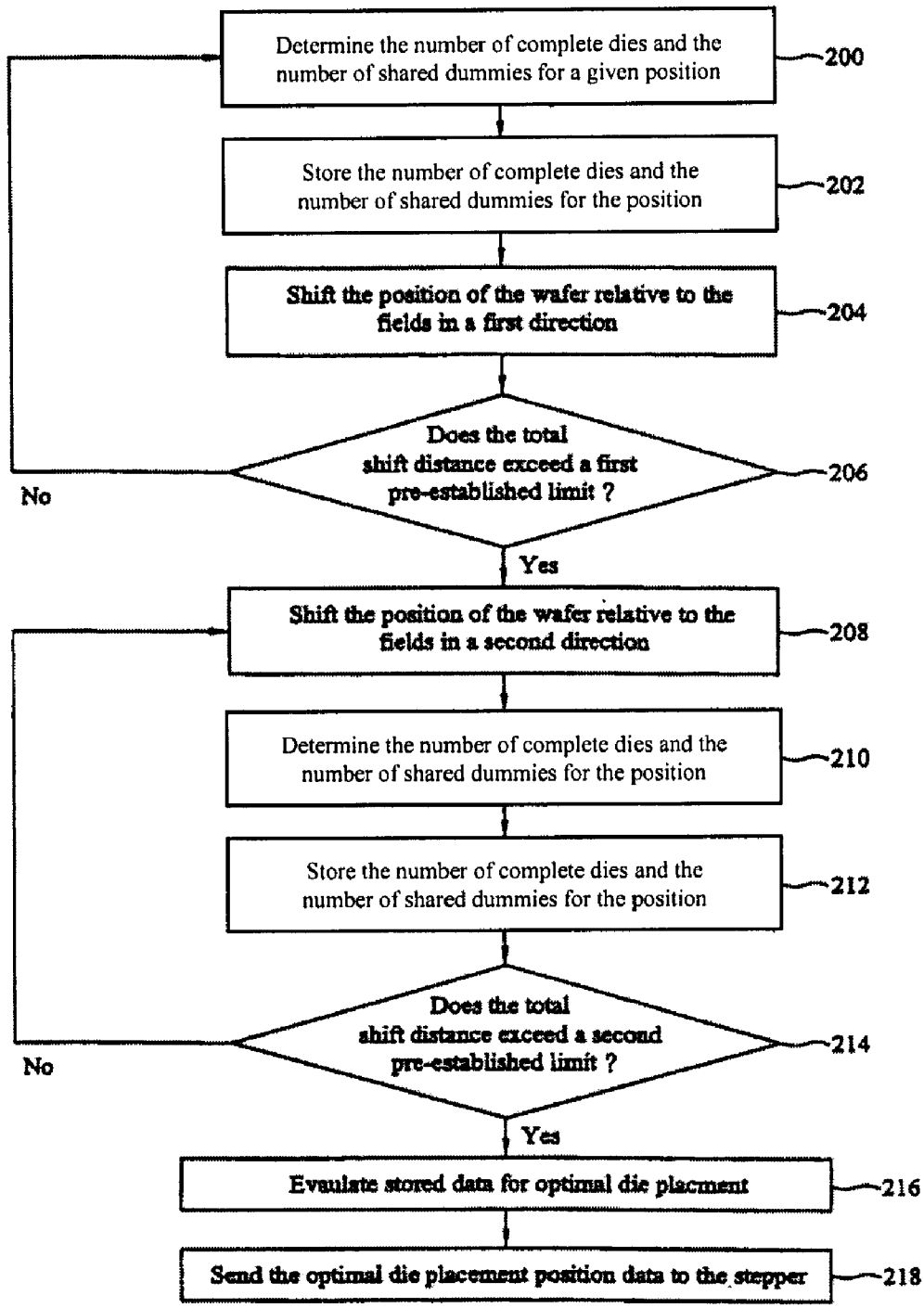
FIGS. 2 and 3 are flow charts of an exemplary die placement optimization method.

FIG. 2 is a flow chart detailing an exemplary method of optimizing die placement for the semiconductor manufacturing system 100. In one exemplary embodiment, the flow chart of FIG. 2 may be performable by the computing system 102 using data bits or computer programming instructions stored within the memory. Accordingly, in this embodiment, each of the steps described within the flow chart may be performed using only the computing system 102, independent of the remaining components of the semiconductor manufacturing system 100. In such an embodiment, wafers, die, and fields (groups of die corresponding to the reticle) may each be represented by graphical data processable by the computing system 102. In another exemplary embodiment, the computing system 102 may digitally perform the method using an image of an actual wafer of the substrate 110. In this exemplary embodiment, digital images of field and die may be superimposed over an actual image of the substrate 110. Other methods also may be used to align die fields upon a wafer.

To achieve efficiencies in manufacturing, fields of die may be tightly placed upon a wafer. Tightly fitted fields increase the total number of die that may be manufactured on a single wafer. Since it is typically not desired to have unexposed expanses of wafer space, due to various processing requirements, dummies (or incomplete fields) may also be used on the wafer where wafer limitations do not allow a full field to be generated. A dummy is typically created by shielding a portion of the mask 106 to resize the corresponding image being exposed on the wafer.

One example of a wafer limitation precluding a full field from being generated is an alignment mark on the wafer. An alignment mark typically requires a certain amount of exposed space around the mark to ensure that an alignment system can properly detect the marks. This requirement can preclude a full field to be exposed at a certain location of the wafer, thereby requiring dummies to be generated to fit in the space between the nearest field and the alignment mark. The dummy can be sized to fill as much of the space as possible, without violating the space rules for the alignment mark and other yield concerns.

As known in the art, generating a dummy on a wafer may take a significant amount of time. This is due, at least in part, to the additional amount of time required to detect and calculate the focal plane of the mask 106 to generate the dummy. Also, since each exposure (or "shot") of either a dummy or field requires a predetermined amount of processing time, dummies inherently add to the overall wafer processing time. Accordingly, minimizing the number of dummy shots on a given wafer, and alternatively, placing the die so that dummies use the same or a similar focal plane, reduces the amount of time required for adjustment of manufacturing components. As used in this disclosure, two or more dummies that have the same size or area, and/or share the same focal plane, are referred to as "shared dummies." Because of the efficiencies arising via the proposed dummy sharing method, such as less time calculating and adjusting focal planes for each dummy, a decrease in wafer processing time can be achieved.

Figure 3:
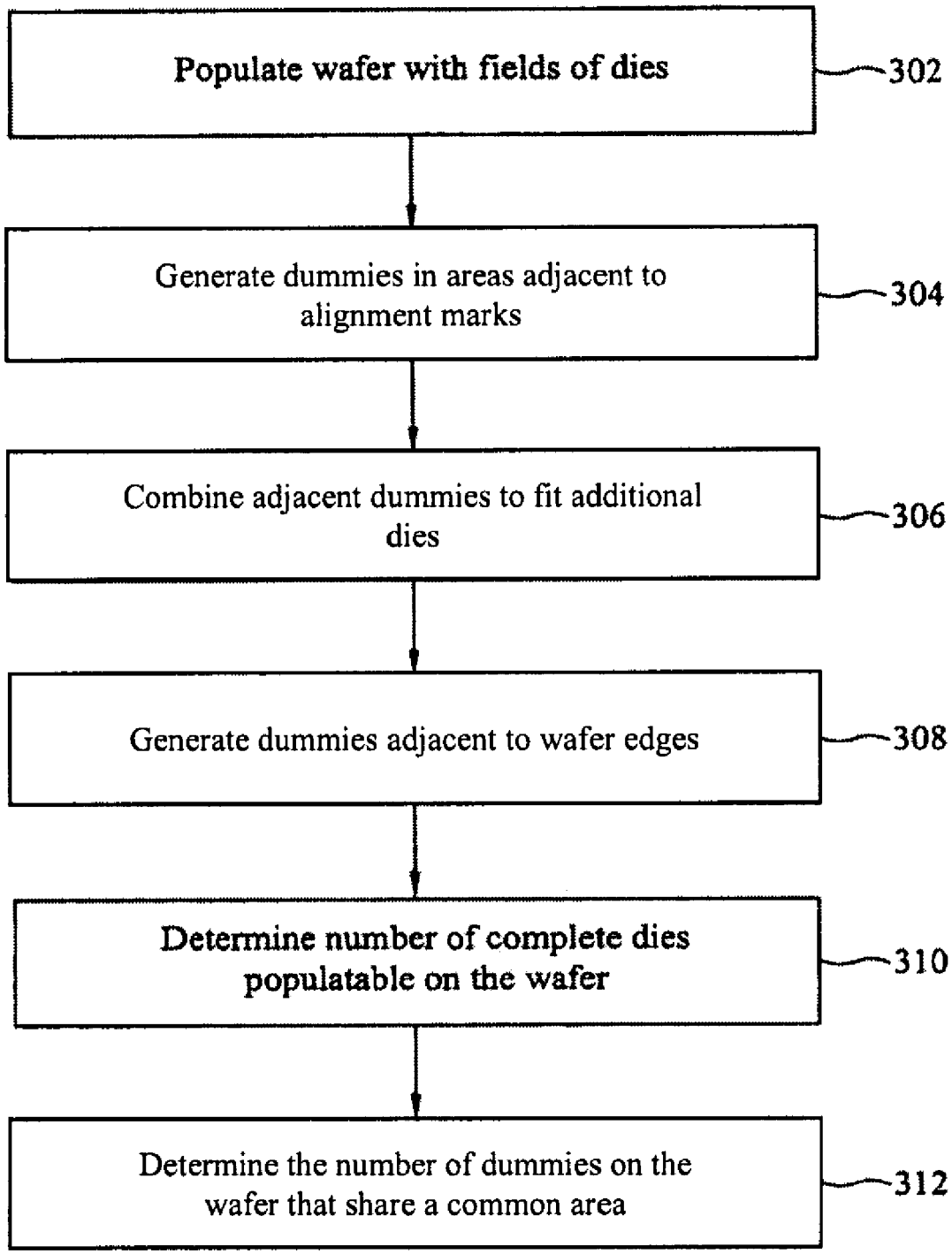
Figure 4:
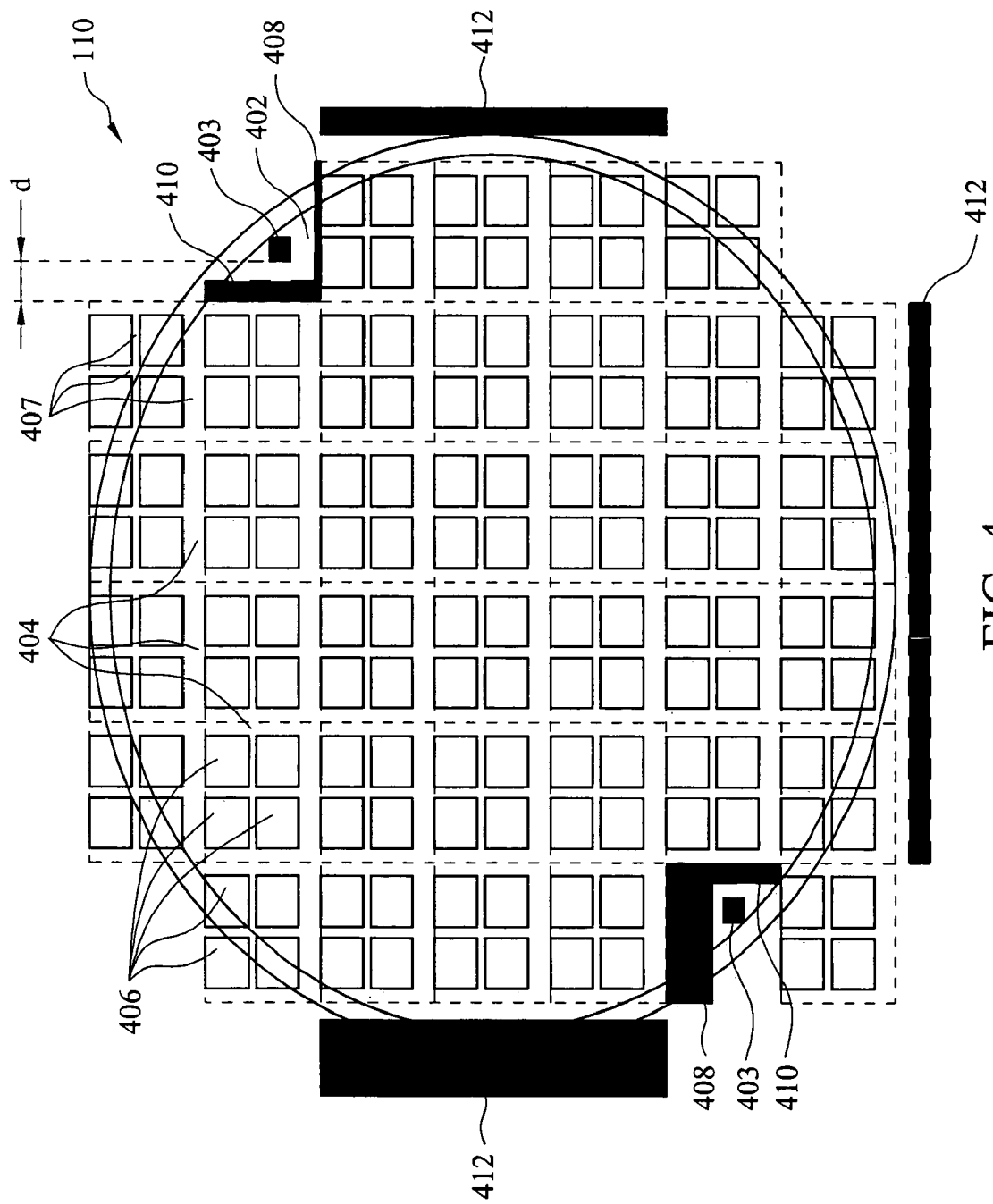
FIGS. 4-6 are line drawings of exemplary semiconductor substrates with fields of die.

Turning now to the exemplary method for optimizing die placement of FIG. 2, at step 200 the computing system 102 determines the number of complete die, the number of fields, and the number of shared dummies for a given field placement on the wafer. This may be accomplished using data inputs of chip size, field size, street width (the space surrounding a die), and alignment mark position. One exemplary method for determining the number of good die, the number of fields, and the number of shared dummies is described with reference to FIGS. 3 and 4. FIG. 3 is a flow chart detailing exemplary method steps, while FIG. 4 shows an exemplary substrate 110. In one exemplary embodiment, the substrate 110 of FIG. 4 may be an image represented by digital data usable by the computing system 102 to determine an optimal die placement. The image of the substrate 110 of FIG. 4 may include a wafer 402, with alignment marks 403.

With reference to FIGS. 3 and 4, at step 302, a wafer 402 (corresponding to the substrate 110 of FIG. 1) is populated with fields 404. The fields 404 may include a plurality of die 406 separated by streets 407. In the embodiment shown, the fields 404 each include four die 406. However, any number of die 406 may be included on a field 404. The wafer 402 is populated with the fields 404 in a manner to fit as many fields 404 as may practically be placed. However, as shown in FIG. 4, the fields 404 are not placed over the alignment marks 403.

At step 304, areas adjacent the alignment marks 403 are populated with dummies by the computing system 102. The dummies provide support to adjacent fields 404, and in FIG. 4, are represented as horizontal dummies 408 and vertical dummies 410. In one exemplary embodiment, the dummies 408 or 410 may be placed between the fields 404 and the alignment marks 403 only when the distance between the alignment marks 403 and the edge of the fields 404 exceeds a predetermined distance. For example, in FIG. 4 the alignment marks 403 and the adjacent edge of the field 404 are separated by a distance d. Placing a dummy too close to the alignment mark 403 may disrupt the alignment mark 403, thereby raising the potential of misalignment, making manufacturing difficult, as discussed above. Accordingly, when the distance d is less than the predetermined distance, the computing system 102 will not generate a dummy between the alignment mark 403 and an edge of the field 404. However, when the distance d is greater than the predetermined distance, the dummies 408 or 410 may be separately placed.

At step 306, the areas of overlapping horizontal and vertical dummies 408, 410 may be combined to create dummy areas that may fit additional die 406 of a field 404. With reference to FIG. 4, the lower left alignment mark 403 is adjacent to the horizontal dummy 408 and the vertical dummy 410. In this exemplary embodiment, the horizontal dummy 408 may have a size greater than the size of a die 406. Therefore, the overlapping areas of the horizontal dummy 408 and the vertical dummy 410 may be absorbed into the horizontal dummy 408, thereby rendering the area of horizontal dummy 408 equal to or greater than the size required to fit one or more additional die 406.

It is noted that the computing system 102 may determine whether a die 406 will fit on a dummy area or a field area without consideration of the area of the street 407. Therefore, when determining whether a die 406 fits on a wafer in place of the dummy or a field, the computing system 102 may consider the size of the die 406 independent of the size of the street 407. Because of this, the street 407 may be allowed to project into areas that may be affected by edge rinse or half-shadows. Disregarding the area of a street 407 around a die 406 when determining whether a die 406 might fit in place of a dummy or a field may allow a more precise determination of the number of good dies.

At step 308, the computing system 102 generates edge dummies 412. Placed about edges of the wafer 102, the edge dummies protect adjacent fields 404 from loading effects that occur during other wafer process steps. An example of the edge dummies 412 is shown in FIG. 4. In one exemplary embodiment, the computing system 102 may be configured to determine the placement position for dummies 412 after determining whether there is meaningful space to expose the edge dummy 412. This may be done independent of the edge of the wafer 402 and independent of the flat area of the wafer 402, and after determining whether there is a good die populatable within the edge dummy.

At step 310 the computing system 102 determines the number of good die that may be populatable on the wafer 402. For example, again referencing FIG. 4, the horizontal dummy 408 in the lower left corner of the wafer 402 may provide space for an additional die 406 that may be populatable on the wafer 402. By considering the areas of the dummies 408, 410, the computing system 102 predicts and determines the number of good die 406 populatable on the wafer 402. At step 312, the computing system 102 determines the number of fields and shared dummies on the wafer 402. As described above, shared dummies have a common size and/or a common focal plane. Because calculating the focal plane for each dummy can be time consuming, shared dummies provide manufacturing efficiencies by reducing the number of times that a focal plane needs to be calculated as the same or similar focal plane may be used for more than one dummy.

Figure 5:
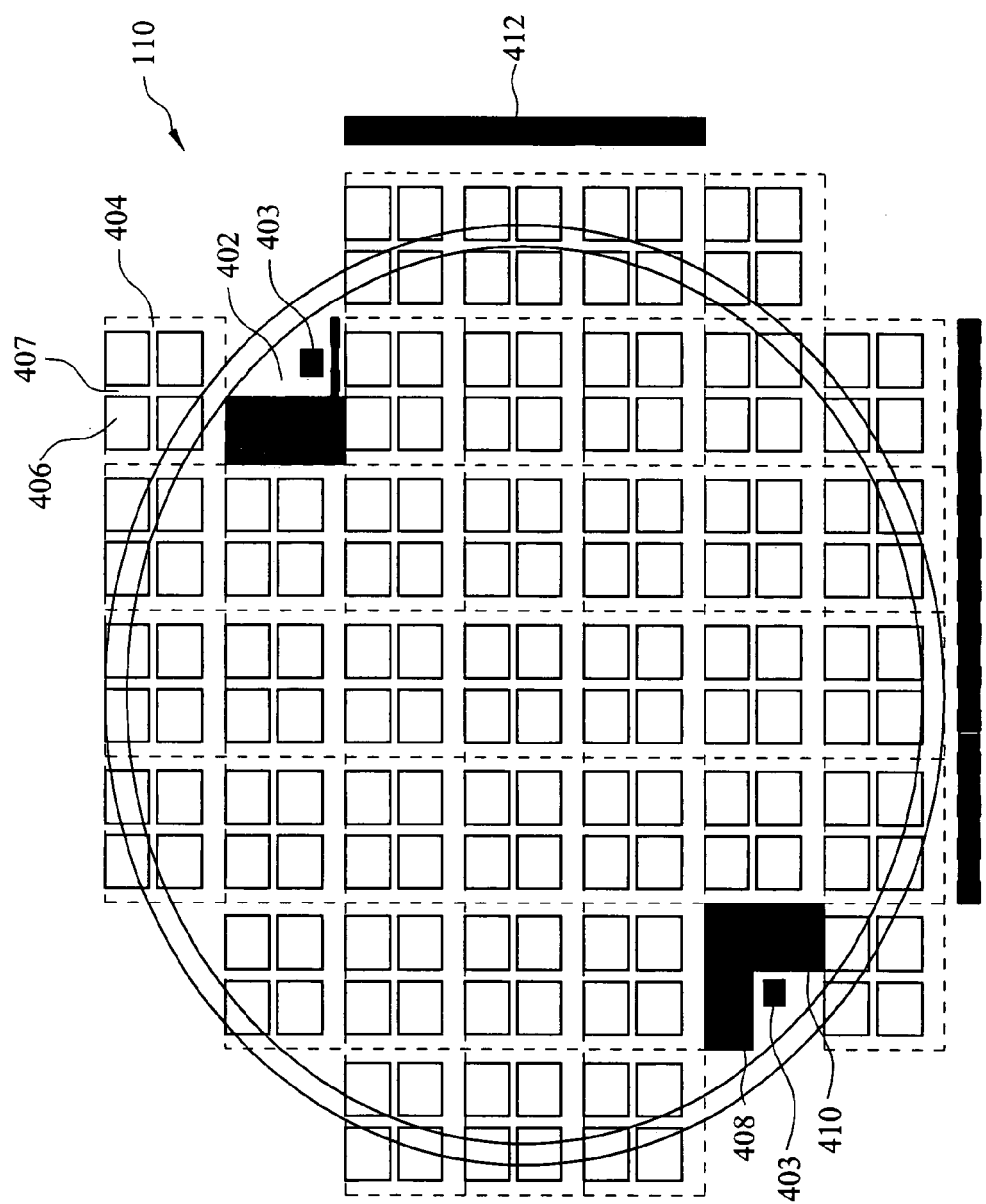

Returning to FIG. 2, at step 202, the number of good die 406, the number of fields 404, and the number of shared dummies for the position of the wafer 402 relative to the fields 404 may be stored by the computing system 102. Storage may be in the memory of the computing system 102, a separate storage component, such as a database, or other storage system. At step 204, the position of the wafer 402 relative to the die fields 404 may be shifted in a first direction, such as, for example, along an x-axis. Such a shift is represented in FIG. 5. The shift shown in FIG. 5 is exaggerated for clarity, as an actual shift may be, for example, only a small percentage of a width of a chip or die 406. As can be seen in FIG. 5, by shifting the wafer 402 relative to the fields 404, the number of die 406 that may fit on the wafer 402 changes. For example, in FIG. 5, the areas of horizontal dummies 408 and the vertical dummies 410 are changed compared to those of FIG. 4. This change in area may affect the number of good die populatable on the wafer 402, and also may affect the number of dummies. In one exemplary embodiment, the shift distance may be in the range of 1/100th to 1/200th of the width of a die 406. Other shift distances, both greater and smaller, may be used as would be apparent to one skilled in the art.

Steps 200-204 are repeated until at step 206, the computing system 102 determines a total distance shifted exceeds a first pre-established limit. The total number of shifts required before reaching the pre-established limit may be, for example, in the hundreds or thousands.

If the total shift distance does exceed the first pre-established limit, then the method advances to step 208, where the position of the wafer 402 relative to the die fields 404 is shifted in a second direction. In one exemplary embodiment, the shift in a second direction may be a shift that is perpendicular to the shifts of the first direction, such as, for example, along the y-axis. Additionally, it should be recognized that the shift directions may be varied, such as alternated between a shift in the first direction and a shift in the second direction.

Figure 6:
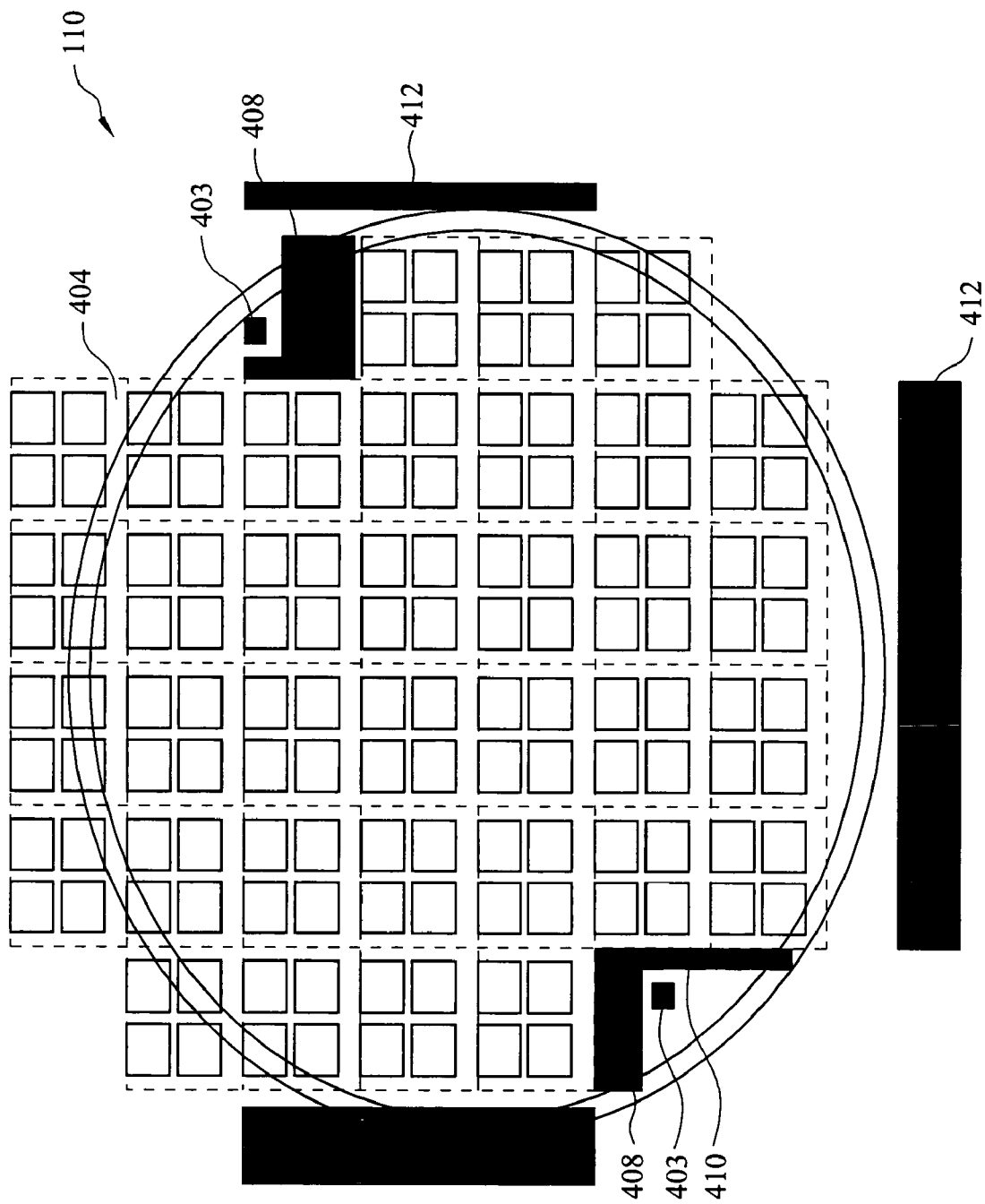

FIG. 6 shows one example of the wafer 402 shifted relative to the fields 404 in the second direction. Like FIG. 5, the shift in FIG. 6 is exaggerated for clarity. As described above, with each shift, the number of die 406 that may fit on the wafer 402 may change. For example, the proportion of edge fields that are within the wafer changes at each new position, possibly affecting the number of good die populatable on the wafer 402 as well as the number of dummies.

At step 210, the computing system 102 determines the number of good die, the number of fields, and the number of shared dummies for the given shifted position. Step 210 may be accomplished using the same steps described above with reference to FIG. 3. At step 212, the number of good die, the number of fields, and the number shared dummies for the given position may be stored by the computing system 102 in a manner similar to that of step 204.

Steps 208-212 are repeated until at step 214, the computing system 102 determines the total shift distance exceeds a second pre-established limit. In one exemplary embodiment, the second pre-established limit may be a distance different than the distance of the first pre-established limit.

If at step 214 the total shift distance exceeds the second pre-established limit, then the method advances to step 216 where the data that was stored, including the number of good die, the number of fields, and the number of shared dummies for each position, may be evaluated.

Figure 7:
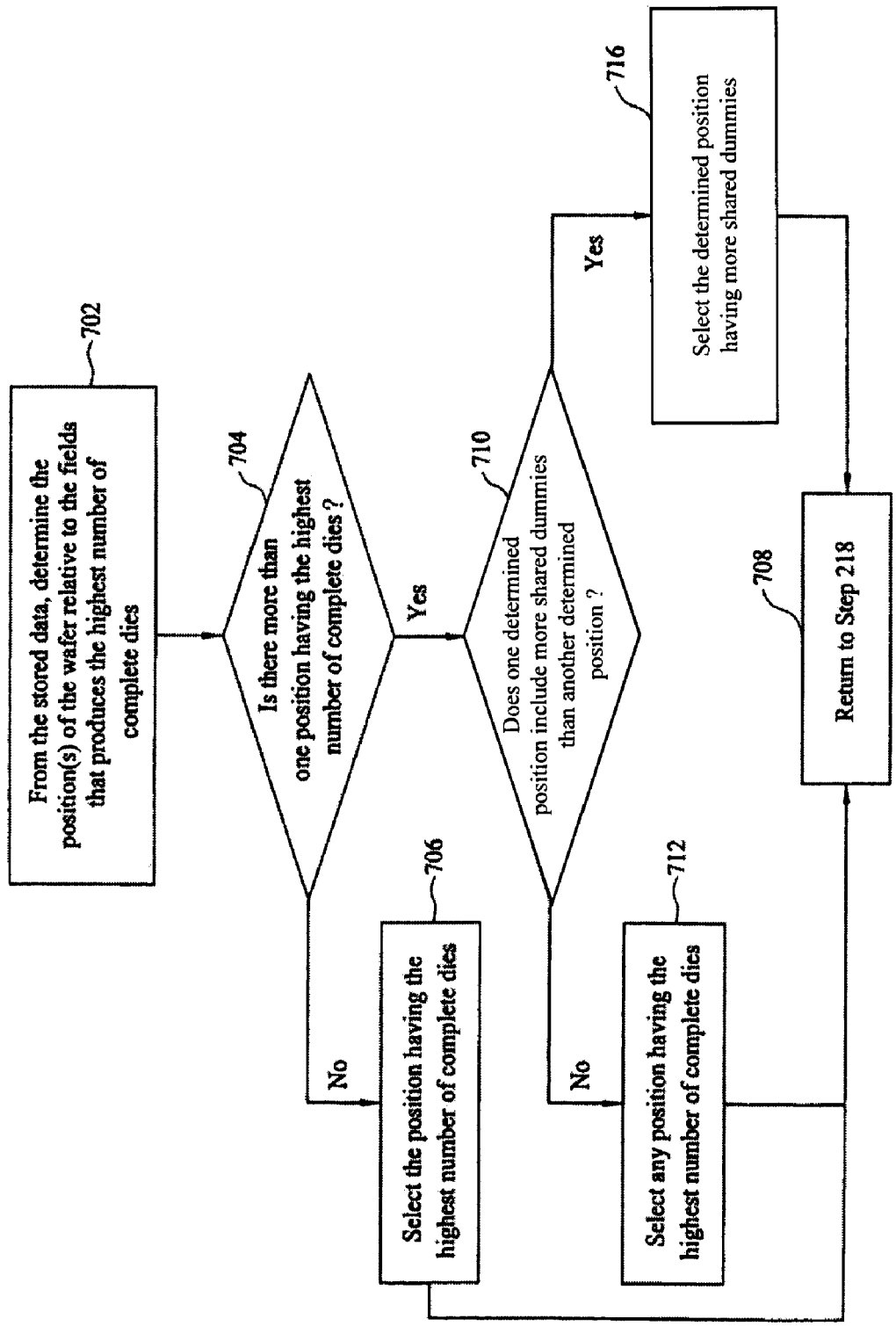
FIG. 7 is a flow chart of an exemplary die placement optimization method.

FIG. 7 is a flow chart setting forth one exemplary method for evaluating the stored data and determining the positions of the wafer 402 and fields 404 that provide optimal die placement. At step 702 in FIG. 7, the computing system 102 determines the stored positions of the wafer 402 and fields 404 that have the highest number of good die. At step 704 the computing system 102 determines whether there is more than one position having the highest number of good die. For example, the computing system 102 may determine that there are multiple positions that all allow the same maximum number of die to be generated. If, at step 704, there is not more than one position having the highest number of good die, then the position having the highest number of good die is selected as the optimal die placement position at step 706. At step 708, the method returns to step 218 of FIG. 2.

If at step 704 there is more than one position that has the highest number of good die, the computing system 102 evaluates the number of fields, the number of dummies and the number of these that are shared. At step 710 the computing system may determine that none of the positions having the highest number of die 406 includes less fields and dummies than any of the other determined positions. If this is the case, then each of those positions may be considered the optimal die placement position. Accordingly at step 712, the computing system 102 may select any of those positions having the highest number of good die as the optimal die placement position at step 712. The method then advances to step 708, thereby returning to step 218 of FIG. 2.

If at step 710 the computing system 102 determines that one or more of the positions having the highest die number includes less fields and dummies than one or more of the other positions also having the highest die numbers, then at step 716, the computing system 102 may select the determined position based on two factors: the number of dummies and the number of shared dummies. Determining which of these two factors (number of dummies and number of shared dummies) adds more to the wafer processing time may be different for different systems 100 (FIG. 1). If shared dummies provide a time savings greater than the exposure time, the number of shared dummies will be of more importance to time savings than the overall number of dummies.

Consider the following example of Table 1, below. In this example, step 202 was performed twice, storing the values identified as Wafer Positions 1 and 2, and step 212 was performed twice, storing the valued identified as Wafer Positions 3 and 4. As can be seen from the table, Wafer Position 1 does not have the highest number of good die, so in the present embodiment, this position will not be further considered. The remaining three Wafer Positions all share the same number of good die—405 die.

TABLE 1

| Wafer Position (Die arrangement) | Good Die | Total Dummies | Shared Dummies |
|---|---|---|---|
| 1 | 395 | 3 | 1 |
| 2 | 405 | 4 | 0 |
| 3 | 405 | 4 | 2 |
| 4 | 405 | 3 | 0 |

It can be seen that Wafer Positions 2 and 3 each have 4 dummies, yet position 3 has two shared dummies. Therefore, Wafer Position 3 is preferred over position 2. Also in the present example, Wafer Position 4 has fewer dummies than Wafer Position 3. Selecting between these two positions is determined by the time savings over having shared dummies. If it takes 5 time units to prepare (e.g., focus) and expose each new dummy, and only 1 time unit to prepare and expose a shared dummy, Wafer Position 3 requires 5+5+5+1=16 time units, while Wafer Position 4 requires 5+5+5=15 time units. So Wafer Position 4 would be selected.

At step 708, the method returns to step 218 of FIG. 2. Although the selected wafer position may not provide higher wafer throughput, it aids in manufacturing the maximum good die on the wafer.

In the exemplary embodiment described, the computing system 102 stores each position and compares the total number of dies, the total number of fields, the total number of dummies and the total number of shared dummies for all the positions. In another exemplary embodiment, the computing system 102 is configured to store only the position or positions with the highest number of dies, along with the number of fields, the number of dummies, and shared dummies at those positions. Accordingly, when a new position is found to have a higher number of dies than a previous position, data representing the new position overwrites the data representing the old position. Other methods also may be used.

Returning to FIG. 2 at step 218 the optimal die placement position data is sent from the computing system 102 to the stepper or scanner workstation 104. The stepper or scanner workstation 104 then operates to direct die placement as instructed by the computing system 102 so that dies are placed in the optimal die placement position.

While the method and system described herein is described with reference to a semiconductor processing system, it should be understood that the method and system may be used during manufacturing of other types of systems. For example, instead of determining and storing the number of fields and the number of dummies, the computing system 102 may determine and store the optimal wafer position by comparing the estimated WAT or yield performance. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A method of optimizing die placement on a wafer having at least one alignment mark, comprising:
arranging a first plurality of fields of die on the wafer in a first position;
inserting first and second dummies between the first plurality of fields and the at least one alignment mark;
determining if the first and second dummies are shared dummies;
shifting the wafer position to a second position relative to the first position;
repeating the arranging, inserting, and determining steps for the second position;
selecting between the first and second positions based on, at least in part, whether the first and second dummies corresponding to one of the first and second positions are shared dummies.

2. The method of claim 1 wherein selecting between the first and second positions is further based on:
whether a number of good die on the wafer in the first position exceeds a number of good die on the wafer in the second position.

3. The method of claim 1, wherein shifting the wafer position to the second position includes incrementally shifting the position of the wafer relative to the position of the plurality of fields in a first direction.

4. The method of claim 3 further comprising:
shifting the wafer position to a third position relative to the first and second positions; and
repeating the arranging, inserting, and determining steps for the third position.

5. The method of claim 4, wherein shifting the wafer position to the third position includes incrementally shifting the position of the wafer relative to the position of the plurality of fields in a second direction.

6. The method of claim 5, wherein the second direction is orthogonal to the first direction.

7. The method of claim 5, further comprising:
shifting in the second direction after a total amount of shifting in the first direction.

8. The method of claim 7, further comprising:
shifting in the second direction until the total amount of shifting in the second direction exceeds a second pre-established shifting distance threshold, and wherein one of the first and second shifting distance thresholds is greater than the other.

9. The method of claim 3, wherein shifting the wafer position further includes incrementally shifting the wafer relative to the position of the plurality of fields until the total amount of shifting exceeds a first pre-established shifting distance threshold.

10. The method of claim 1, further comprising:
determining a total number of good die on the wafer at the first position, including any die from the dummies.

11. The method of claim 10, further comprising:
spacing the dummies a pre-designated distance from the alignment mark.

12. The method of claim 1, further comprising:
inserting a third dummy adjacent to fields disposed about an edge of the wafer.

13. The method of claim 1, wherein the first dummy is a horizontally extending dummy and the second dummy is a vertically extending dummy between arranged fields and one of the alignment marks.

14. The method of claim 13, further comprising:
combining at least a portion of the vertically extending dummy and the horizontally extending dummy to create a dummy having an area equal to or greater than an area of at least one die.

15. A program product for optimizing die placement on a wafer having an alignment mark, comprising:
a computer readable memory; and
instructions recorded on the computer readable memory and configured to cause a computer to:

insert a plurality of dummies between at least one arranged field of die and the alignment mark at a first die placement position;

determine the area of each of the plurality of dummies;

compare the areas of the plurality of dummies to determine a number of shared dummies;

repeat the steps of inserting, determining, and comparing for a second die placement position; and select an optimal die placement position based upon a number of shared dummies in each position.

16. The program product of claim 15, wherein the instructions recorded on the computer readable memory are further configured to cause the computer to:

select an optimal die placement position based upon a total number of dummies in each position.

17. A method of optimizing die placement on a wafer, comprising:

arranging images of a plurality of fields on the wafer in a first position;

inserting images of dummies between an image of at least one of the plurality of fields and an image of an alignment mark;

determining the total number of die manufacturable on the wafer if manufactured in locations corresponding to the images at the first position, including any die manufacturable in locations corresponding to the dummies;

determining the area of at least two images of the dummies on the wafer at the first position; and comparing the area of each of the at least two images of the dummies at the first position to determine whether the dummies are shared dummies.

18. The method of claim 17 further comprising:

shifting the images of the plurality of fields to a second position relative to the first position on the wafer;

inserting additional images of additional dummies between an image of at least one of the plurality of fields at the second position and an image of the alignment mark;

determining the total number of die manufacturable on the wafer if manufactured in locations corresponding to the images at the second position, including any die manufacturable in locations corresponding to the additional dummies;

determining the area of a plurality of the images of the additional dummies on the wafer at the second position;

comparing the area of each of the plurality of images of the additional dummies at the second position to determine whether the additional dummies are shared dummies; and considering the total number of die manufacturable on the wafer if manufactured in locations corresponding to the images at the first position, the total number of die manufacturable on the wafer if manufactured in locations corresponding to the images at the second position, the number of shared dummies at the first position, and the number of shared dummies at the second position, to determine the optimized die placement position.

19. The method of claim 18, wherein shifting the images of the plurality of fields to the second position includes incrementally shifting the position of the wafer relative to the position of the images of the plurality of fields.

20. The method of claim 18, further comprising:

shifting the images of the plurality of fields to a third position relative to the second position on the wafer;

inserting further images of further dummies between an image of at least one of the plurality of fields at the third position and an image of the alignment mark;

determining the total number of die manufacturable on the wafer if manufactured in locations corresponding to the images at the third position, including any die manufacturable in locations corresponding to the further dummies;

determining the area of a plurality of the images of the further dummies on the wafer at the third position;

comparing the area of each of the plurality of images of the further dummies at the third position to determine whether the further dummies are shared dummies; and considering the total number of manufacturable die manufacturable on the wafer if manufactured in locations corresponding to the images at the first position, the total number of die manufacturable on the wafer if manufactured in locations corresponding to the images at the second position, the total number of die manufacturable on the wafer if manufactured in locations corresponding to the images at the third position, the number of shared dummies at the first position, the number of shared dummies at the second position, and the number of shared dummies at the third position, to determine an optimized die placement position.

21. A method of optimizing die placement on a wafer having at least one alignment mark, comprising:

arranging a plurality of fields of die on the wafer in a first position;

inserting a first dummy between at least one of the plurality of fields and the at least one alignment mark;

determining whether at least one additional die fits within a first area defined by the first dummy;

arranging the plurality of fields on the wafer in a second position that is shifted relative to the first position;

inserting a second dummy between at least one of the plurality of fields and the at least one alignment mark;

determining whether at least one additional die fits within a second area defined by the second dummy; and selecting between the first and second positions based on, at least in part, whether an additional die fits within the first area or the second area.

* * * * *